(12) United States Patent
Koganezawa et al.

(10) Patent No.: US 7,215,068 B2
(45) Date of Patent: May 8, 2007

(54) PIEZOELECTRIC ACTUATOR HEAD SUSPENSION UNIT EMPLOYING PIEZOELECTRIC ACTUATOR, AND MAGNETIC DISK DRIVE EMPLOYING HEAD SUSPENSION UNIT

(75) Inventors: Shinji Koganezawa, Kawasaki (JP); Hideki Kashima, Yokohama (JP)

(73) Assignees: Fujitsu Limited, Kawasaki (JP); NHK Spring Co., Ltd., Yokohama (JP)

( * ) Notice: Subject to any disclaimer, the term of this patent is extended or adjusted under 35 U.S.C. 154(b) by 202 days.

(21) Appl. No.: 10/929,995

(22) Filed: Aug. 30, 2004

(65) Prior Publication Data
US 2005/0236934 A1    Oct. 27, 2005

(30) Foreign Application Priority Data
Apr. 22, 2004   (JP)   ............................. 2004-126555

(51) Int. Cl.
*H01L 41/047* (2006.01)
(52) U.S. Cl. .................. 310/366; 310/333; 310/363; 310/365
(58) Field of Classification Search .............. 310/333, 310/363, 365, 366
See application file for complete search history.

(56) References Cited

U.S. PATENT DOCUMENTS

| | | | |
|---|---|---|---|
| 6,327,120 B1 * | 12/2001 | Koganezawa et al. ... | 360/294.4 |
| 6,538,854 B2 * | 3/2003 | Koganezawa et al. ... | 360/294.4 |
| 6,597,541 B2 * | 7/2003 | Nishida et al. .......... | 360/294.4 |
| 6,653,761 B2 * | 11/2003 | Fujii et al. .............. | 310/333 |
| 6,817,073 B2 * | 11/2004 | Uchiyama et al. ........ | 29/25.35 |
| 7,006,334 B2 * | 2/2006 | Uchiyama ................ | 360/294.4 |
| 2002/0033652 A1 * | 3/2002 | Serizawa ................. | 310/348 |
| 2002/0043894 A1 * | 4/2002 | Koganezawa et al. ..... | 310/328 |
| 2002/0154450 A1 * | 10/2002 | Kasajima et al. ........ | 360/294.4 |
| 2003/0002126 A1 * | 1/2003 | Doron .................... | 359/242 |

FOREIGN PATENT DOCUMENTS

| | | | |
|---|---|---|---|
| JP | 05018741 A | | 1/1993 |
| JP | 09073346 A | | 3/1997 |
| JP | 11031368 A | | 2/1999 |
| JP | 2001043641 A | | 2/2001 |
| JP | 2001-285995 | * | 10/2001 |
| JP | 2003061371 A | | 2/2003 |

* cited by examiner

Primary Examiner—Thomas M. Dougherty
(74) Attorney, Agent, or Firm—Greer, Burns & Crain, Ltd.

(57) ABSTRACT

A piezoelectric element of a piezoelectric actuator is clamped by two electrodes, each of which has a conductive layer on a insulating layer. At least a connection terminal is formed by extending the conductive layer outside the insulating layer.

20 Claims, 11 Drawing Sheets

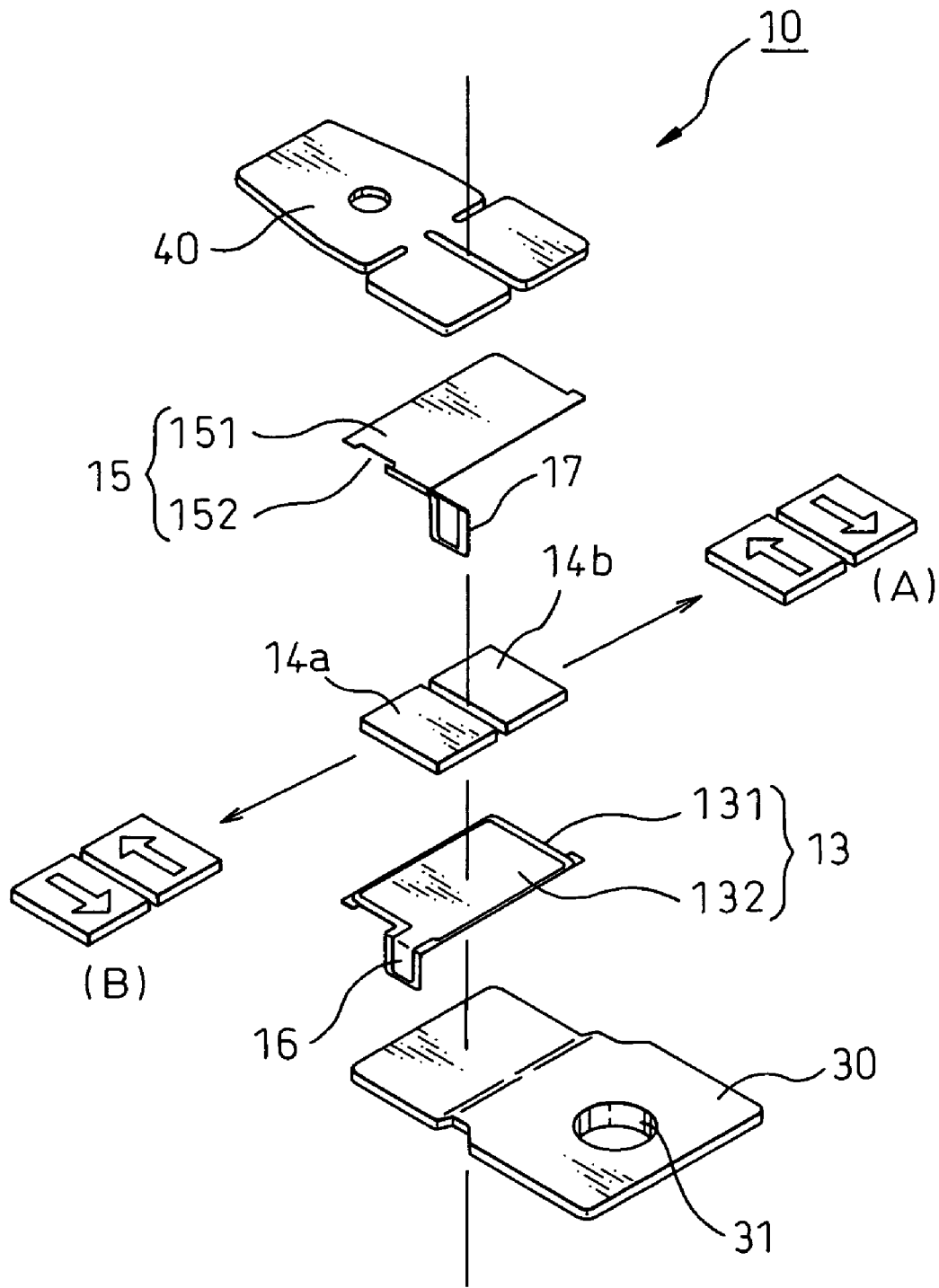

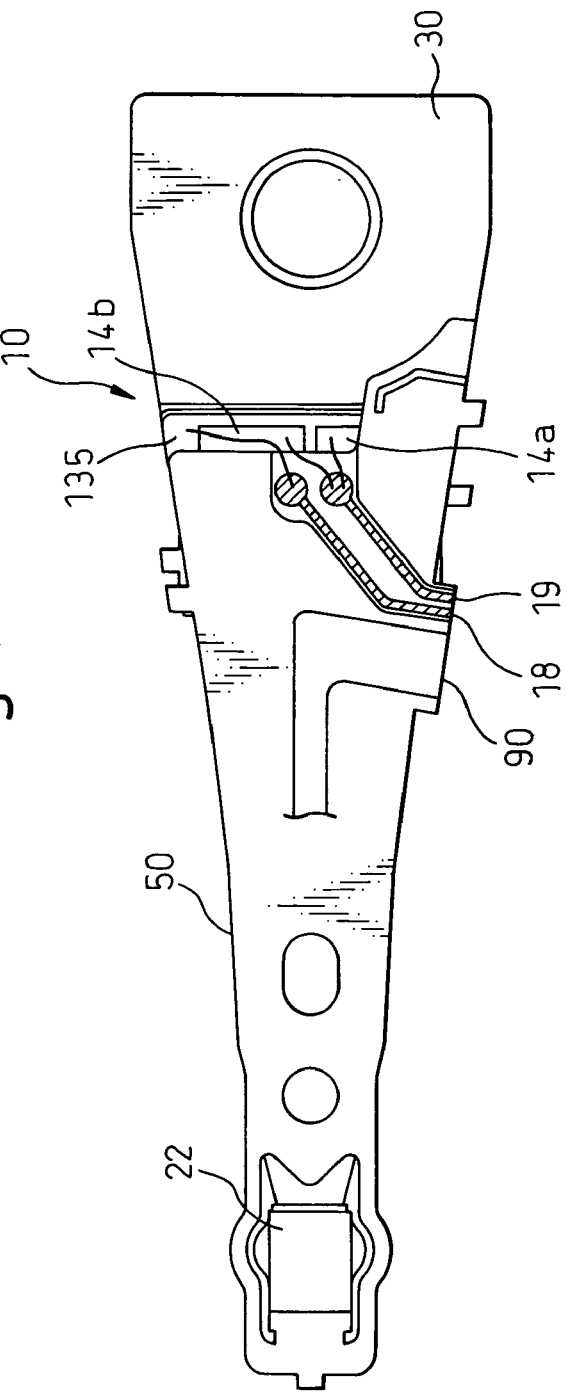
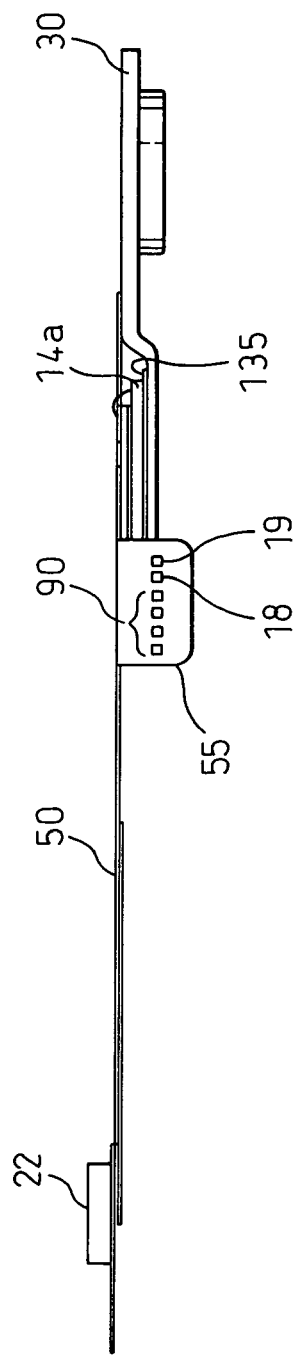
Fig.4A
Fig.4B

PIEZOELECTRIC ACTUATOR HEAD SUSPENSION UNIT EMPLOYING PIEZOELECTRIC ACTUATOR, AND MAGNETIC DISK DRIVE EMPLOYING HEAD SUSPENSION UNIT

BACKGROUND OF THE INVENTION

1. Field of the Invention

The present invention relates to an actuator employing a piezoelectric element in, for example, a head moving actuator employed in a magnetic disk drive.

2. Description of the Related Art

Along with the trend toward more compact and precision information equipment or sensors, there is an increasing demand for an actuator for inching a member. In particular, the demand for an actuator formed by utilizing a piezoelectric element has increased. The piezoelectric actuator is applied to various fields, that is, is applied to a unit for controlling the focus of an optical system, a printing mechanism included in a printer, a unit for driving a probe included in a sensor, or a mechanism for moving a head included in an optical disk drive or a magnetic disk drive (refer to Japanese Unexamined Patent Application Publications Nos. 9-73746 and 5-18741).

By taking a magnetic disk drive for instance, a conventional piezoelectric actuator and its drawbacks will be described below. In the magnetic disk drive, the number of data tracks per unit length (tracks per inch (TPI)) is increased in order to raise a recording density, that is, the width of each track is made narrow in order to improve the recording density offered by the magnetic disk drive. In this case, data must be accurately read or written from or in a narrow track. For this purpose, the precision in positioning a head must be further improved. The piezoelectric actuator is adopted for this purpose.

Specifically, a head moving mechanism has a head suspension, which includes a slider having a magnetic head, fixed to a carriage arm, and the carriage arm is turned in order to move a head. A micro-actuator formed by utilizing a piezoelectric element is adopted for the head moving mechanism in order to slightly move the head suspension or slider, or the head element itself. The present inventor et al. have proposed a shear piezoelectric actuator that utilizes a shear strain in a piezoelectric element (Japanese Unexamined Patent Application Publication Nos. 11-31368 and 2001-43641).

Furthermore, the present inventor et al. have proposed a micro-actuator that has the wiring thereof, which is required for applying a voltage to a piezoelectric element, achieved according to the wire bonding method and that is thin and compact, includes a decreased number of parts, and is thus low in cost (Japanese Unexamined Patent Application Publication No. 2003-61371).

However, when the wire bonding is adapted to directly attach a wire to a piezoelectric element, it poses a problem. Namely, the thickness of the Au electrode film, with which the piezoelectric element is coated, must be equal to or larger than a certain value. Moreover, a stress is applied locally to the piezoelectric element during wire bonding. Furthermore, the electrode side of the piezoelectric element is exposed for the wire bonding.

SUMMARY OF THE INVENTION

Accordingly, an object of the present invention is to provide a piezoelectric actuator in which electric connection to a piezoelectric element can be achieved easily and reliably, a head suspension unit employing the piezoelectric actuator, and a magnetic disk drive employing the head suspension unit.

According to the first aspect of the present invention, there is provided a piezoelectric actuator comprising a piezoelectric element and first and second electrodes that clamp the piezoelectric element. Herein, the first electrode includes an insulating layer, a first conducting layer formed on the insulating layer and brought into contact with one side of the piezoelectric element, and a second conducting isolated from the first conducting layer. The first conducting layer has a first connection terminal extended therefrom outside the insulating layer, and the second conductor has second and third connection terminals extended therefrom outside the insulating layer. The first connection terminal and second connection terminal constitute a pair of terminal electrodes, and the third connection terminal is attached to the second electrode.

According to the second aspect of the present invention, there is provided a piezoelectric actuator comprising a piezoelectric element and first and second electrodes that clamp the piezoelectric element. Herein, at least one of the first and second electrodes includes an insulating layer and a conducting layer formed on the insulating layer and brought into contact with the piezoelectric element. The conducting layer has a connection terminal extended therefrom outside the insulating layer.

According to another aspect of the present invention, there is provided a head suspension unit employing the piezoelectric actuator in accordance with the present invention, and a magnetic disk drive employing the head suspension unit.

In a piezoelectric actuator in accordance with the present invention, as a connection terminal is formed with a conducting layer alone and is flexible, the connection terminal can be relatively freely led out and attached. Consequently, the piezoelectric actuator can be easily wired. Moreover, the piezoelectric actuator can be manufactured at a low cost, and a highly reliable piezoelectric actuator can be realized.

BRIEF DESCRIPTION OF THE DRAWINGS

The above object and features of the present invention will be more apparent from the following description of the preferred embodiments with reference to the accompanying drawings, wherein:

FIG. 2 is an exploded perspective view showing a conventional micro-actuator unit;

FIG. 4A is a front view showing other conventional head suspension assembly and FIG. 4B is a side view thereof;

DESCRIPTION OF THE PREFERRED EMBODIMENTS

Prior to description of the embodiments of the present invention, the related art and the disadvantages thereof will be described with reference to the relevant drawings.

Figure 1A:
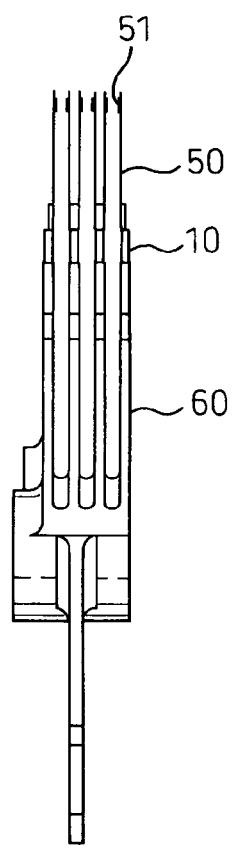
FIG. 1A is a left side view of a magnetic head stack employing a conventional micro-actuator.
Figure 1B:
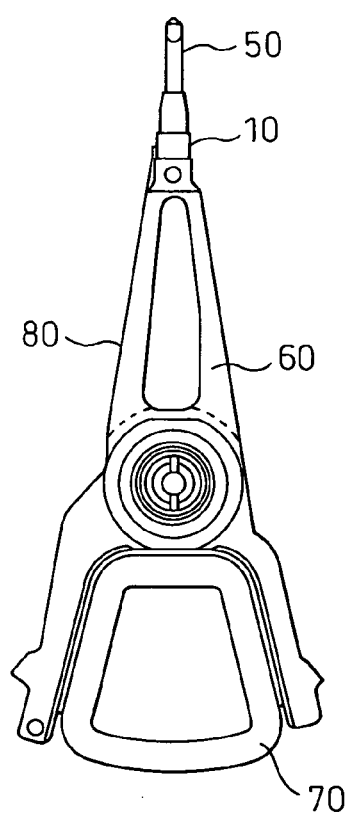
FIG. 1B is a front view thereof.
Figure 1C:
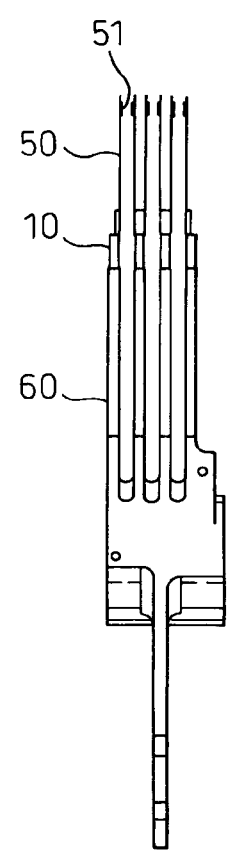
FIG. 1C is a right side view thereof.

FIG. 1A to FIG. 1C show an example of a magnetic head stack included in a magnetic disk drive and provided with a conventional shear piezoelectric actuator, that is, a micro-actuator. FIG. 1B is a front view of the magnetic head stack, FIG. 1A is a left side view thereof, and FIG. 1C is a right side view thereof.

The conventional magnetic head stack has shear piezoelectric actuators 10 each of which intervenes between a head suspension 50 including a head slider 51 and a carriage arm 60. The carriage arm 60 is turned by a voice coil movement (VCM) 70, whereby the head suspension 50 is moved in a radial direction of a magnetic disk. The piezoelectric actuator 10 inches the head suspension 50 relative to the carriage arm 60 so as to adjust the position of the head suspension 50. One piezoelectric actuator 10 bears one or two head suspensions 50. A magnetic disk is rotated while being interposed between opposed head sliders, though the magnetic disk is not shown. Electric connections to the piezoelectric actuator and the head are achieved using a relay flexible printed-circuit (FPC) 80 laid along one lateral side of the carriage arm. In this example, as apparent from the drawings, data recorded on both sides of each of three magnetic disks can be read or written.

FIG. 2 is an exploded perspective view of the micro-actuator 10. The micro-actuator 10 comprises a base 30 having a convex riveting part 31, with which the micro-actuator 10 is fixed to the carriage arm 60, formed on one edge thereof, a base electrode 13 fixed to the top of the base 30, two piezoelectric elements 14a and 14b, a movable electrode 15, and a movable member 40. The base 30, base electrode 13, piezoelectric elements 14a and 14b, movable electrode 15, and movable member 40 are layered on one another. The suspension is fixed to the movable member. The base electrode 13 includes at least an insulating layer 131 and a conducting layer 132, and the movable electrode 15 includes an insulating layer 151 and a conducting layer 152. The conducting layer 132 included in the base electrode 13 and the conducting layer 152 included in the movable electrode 15 are brought into contact with the tops and bottoms of the piezoelectric elements 14a and 14b. The insulating layers 131 and 151 are included in order to isolate the conducting layers 132 and 152, which are used to drive the piezoelectric elements 14a and 14b respectively, from other members. Portions of the electrodes 13 and 15 are appropriately folded, whereby conduction tabs, that is, connectors 16 and 17 are formed.

When a voltage is applied to a shear piezoelectric element in a thickness direction thereof, the top of the piezoelectric element is displaced in the direction of a shear strain with respect to the bottom thereof. FIG. 2A and FIG. 2B show piezoelectric elements whose directions of polarization are perpendicular to the thickness directions thereof and are opposite to each other. When a voltage is applied to the base electrode 13 and movable electrode 15, the movable member 40, that is, the head suspension can be inched horizontally.

Figure 3A:
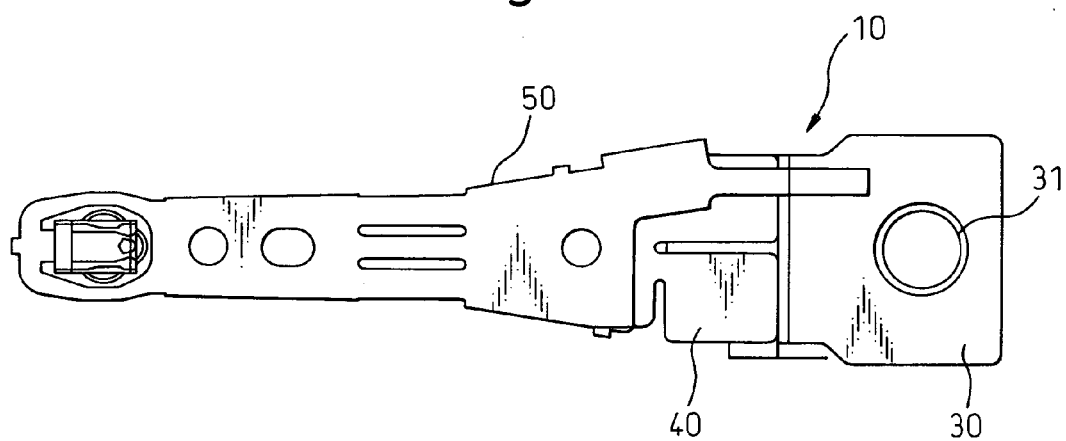
FIG. 3A is a front view of a conventional head suspension assembly and FIG. 3B is a side view thereof.
Figure 3B:
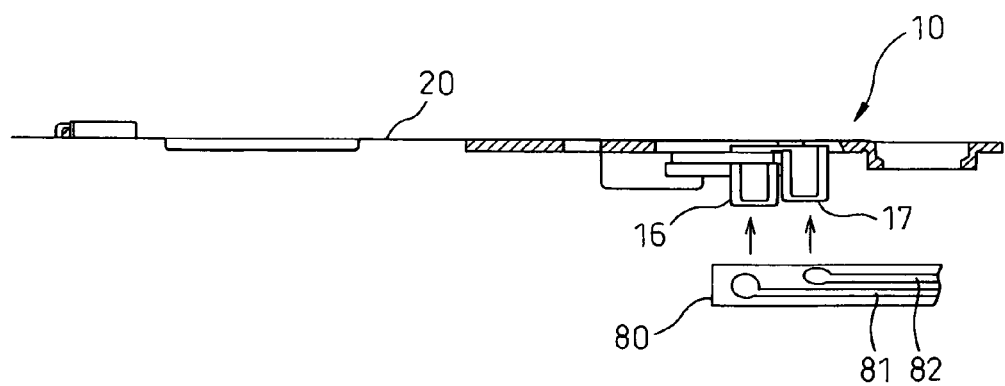

FIG. 3A and FIG. 3B show an example of a head suspension assembly using the foregoing piezoelectric actuator as a micro-actuator and an example of a wiring structure. FIG. 3A is a front view of the head suspension assembly, and FIG. 3B is a side view thereof. A head suspension 50 is fixed to a movable member 40 of the micro-actuator, and can be inched relative to a base 30 included in the micro-actuator 10 fixed to a carriage arm 60. As shown in FIG. 3B, connectors 16 and 17 of electrodes clamping piezoelectric elements are juxtaposed on a lateral side of each of the micro-actuator. The connectors 16 and 17 are attached to conduction circuits 81 and 82 respectively included in a relay FPC 80 laid along one lateral side of the carriage arm or head suspension. The relay FPC is coupled to a main FPC on which an amplification circuit and others are placed.

As mentioned above, a relay FPC is used for wiring. The relay FPC is used for not only a connection needed for driving piezoelectric elements but also for connections needed for writing a signal in a head and for reading a signal from the head (reading/writing signal). If two (or three) separate tabs are included as connectors via which connections are made with the relay FPC 80 for writing or reading a signal from or in the head and for driving the piezoelectric elements, and are located opposite to the carriage arm 60, both a reading/writing signal relay FPC and a micro-actuator driving relay FPC are needed. An extra cost is required.

Moreover, if both the connectors via which connections are made for transmitting a reading or writing signal and for driving a micro-actuator are located on the same side of the carriage arm and attached to one relay FPC, a positional difference between the two connectors must be diminished. When the connectors are attached to the relay FPC, if the two surfaces of the two connectors are deviated from each other (for example, deviated from each other as if to be steps), it becomes hard to attach the connectors to the relay FPC. Consequently, assembling requires strict precision, and an extra cost is needed for assembling.

In recent years, a structure having a relay FPC, on which a head signal line is formed, laid along a head suspension or integrated into the head suspension (long tailed type) has come to be used extensively. The method employing a plurality of tabs cannot cope with a variety of applications.

Figure 5A:
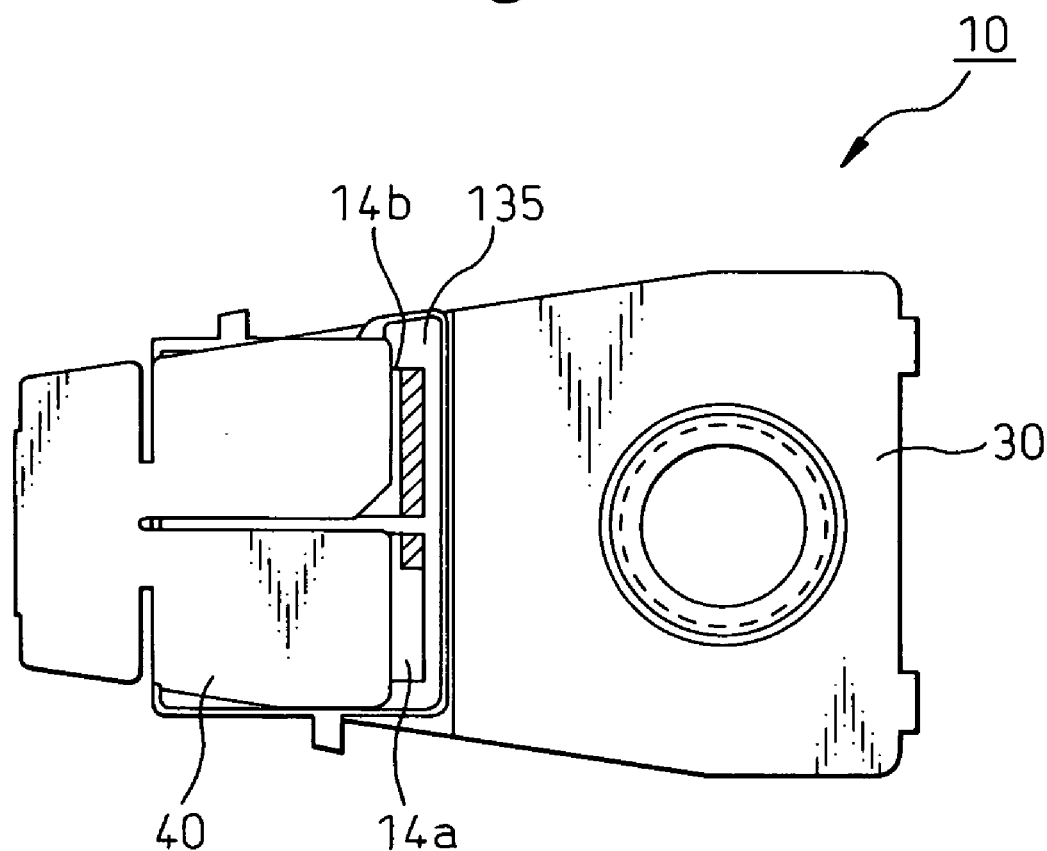
FIG. 5A is a front view of a micro-actuator employed in other conventional head suspension assembly and FIG. 5B is a side view thereof.
Figure 5B:
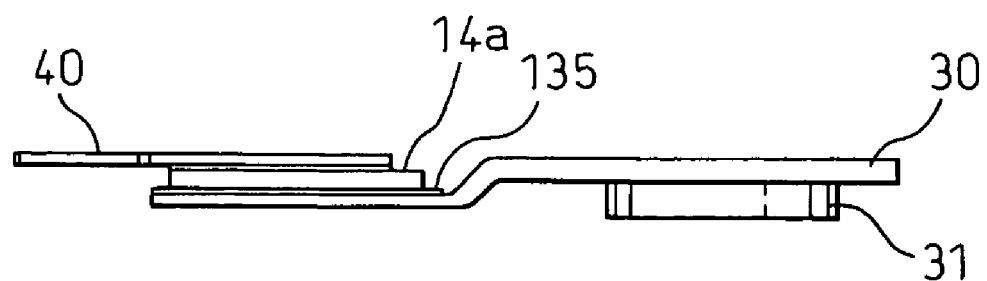

As a solution, the present inventor et al. have proposed a connection method shown in FIG. 4A to FIG. 5B. FIG. 4A and FIG. 4B are a front view and a side view of a head suspension assembly comprising a micro-actuator 10 and a head suspension 50 including a slider 22. FIG. 5A and FIG. 5B are a front view and a side view of the micro-actuator 10 included in the head suspension assembly.

The micro-actuator 10 has, as shown in FIG. 5A and FIG. 5B, a base 30, a base electrode 135, two piezoelectric elements 14a and 14b, and a movable member 40 layered in that order. The base electrode 135 is larger than an area occupied by the piezoelectric elements 14*a* and 14*b*. The tops of the piezoelectric elements 14*a* and 14*b* are covered with an electrode film, and portions of the electrode films appear out of the movable member 40.

In order to apply a voltage to the piezoelectric elements, as shown in FIG. 4A, lines 18 and 19 are formed on the head suspension 50, connecting one of the lines, that is, the line 18 to the base electrode 135 through wire bonding, connecting the other line 19 to the exposed portions of the tops of the piezoelectric elements 14*a* and 14*b* through wire bonding. Moreover, lines 90 over which a reading/writing signal is transmitted to the head are formed on the head suspension 50. A tab 55 formed by folding the head suspension 50 is used to connect the lines with the FPC.

Compared with the head suspension assembly shown in FIG. 3, the head suspension assembly shown in FIG. 4 is designed to be thin and lightweight by removing the movable electrode and results in the low cost. As a wiring can be freely led owing to the adoption of the wire bonding method, four head terminals and two terminals of micro-actuator driving lines can be formed on the one tab 55. Moreover, the head suspension assembly can be readily adapted to a long tailed head suspension.

However, in order to directly attach a wire to a piezoelectric element through wire bonding, the thickness of Au serving as an electrode film on the piezoelectric element must be equal to or larger than a certain value. Therefore, the piezoelectric element becomes expensive. Moreover, as a stress is applied locally to the piezoelectric element during the wire bonding, a crack may be created. Furthermore, as the electrode side of the piezoelectric element is exposed for the wire bonding, whether reliability can be maintained for a prolonged period of time is concerned.

Accordingly, an object of the present invention is to provide a piezoelectric actuator in which electric connection to a piezoelectric element can be achieved highly reliably and easily, and a head suspension unit employing the piezoelectric actuator.

Referring to FIG. 6 to FIG. 12, embodiments of the present invention will be described below. An example of a magnetic head moving device will be described below. However, a piezoelectric actuator in accordance with the present invention is not limited to the application to the magnetic head moving device. As for reference numerals in the drawings, the same reference numerals are assigned to identical members. If members described in conjunction with one drawing appear in any other drawing, the description of the members may be omitted.

First Embodiment

Figure 6A:
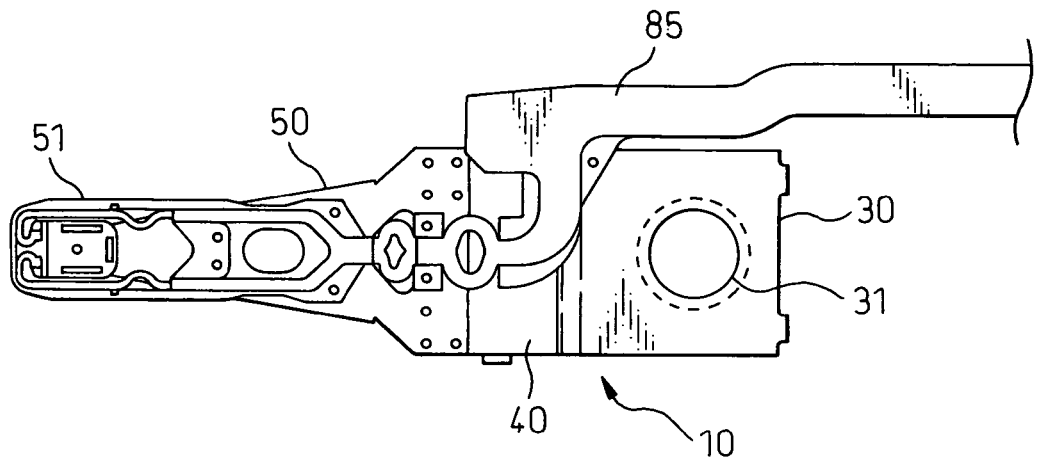
FIG. 6A is a top view of a head suspension assembly in accordance with a first embodiment of the present invention.
Figure 6B:
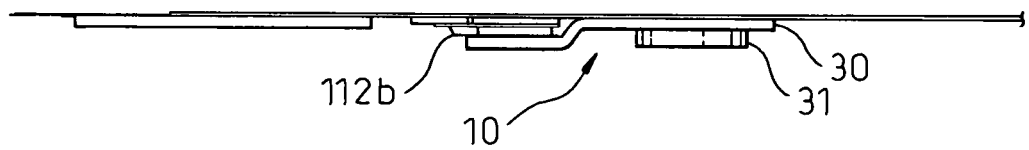
FIG. 6B is a side view thereof.

FIG. 6A to FIG. 9C show a first embodiment. FIG. 6A to FIG. 6C show a head suspension assembly in accordance with the first embodiment of the present invention. FIG. 6A is a plan view showing a side on which a slider is disposed opposite to a side facing a magnetic disk. FIG. 6B is a side view, and FIG. 6C is a plan view showing the side opposite to the side shown in FIG. 6A. FIG. 7A to FIG. 7C show an actuator unit 10 included in the head suspension assembly. In line with FIG. 6A to FIG. 6C, FIG. 7A is a plan view showing a side on which a movable member is bared, FIG. 7B is a side view, and FIG. 7C is a plan view showing a side, on which a base is bared, opposite to the side shown in FIG. 7A.

The head suspension assembly comprises a head suspension 50 having a slider (not shown) on which a head is mounted, and an actuator unit 10 having a convex riveting part 31. The actuator unit 10 is fixed to a carriage arm, which can pivot, via the convex riveting part. The head suspension assembly and carriage arm constitute a head moving mechanism to be included in a magnetic disk drive. As shown in FIG. 7, in the present embodiment, similarly to the aforesaid related art, a shear strain made by a piezoelectric element is utilized. Namely, the actuator unit 10 has a base electrode 11 and a movable electrode 42 vertically interposed between a base 30 and a movable member 40. Two piezoelectric elements 14*a* and 14*b* are clamped by the base electrode and movable electrode 42. The directions of polarization in which the piezoelectric elements are polarized are perpendicular to a direction in which a voltage is applied, and are opposite to each other. The upper and lower electrodes 11 and 42 each comprises three layers, for example, a SUS layer, an insulating layer made of polyimide, and a conducting layer made of Cu. It should be noted that a piezoelectric actuator in accordance with the present invention is not limited to a shear piezoelectric actuator.

Figure 6C:
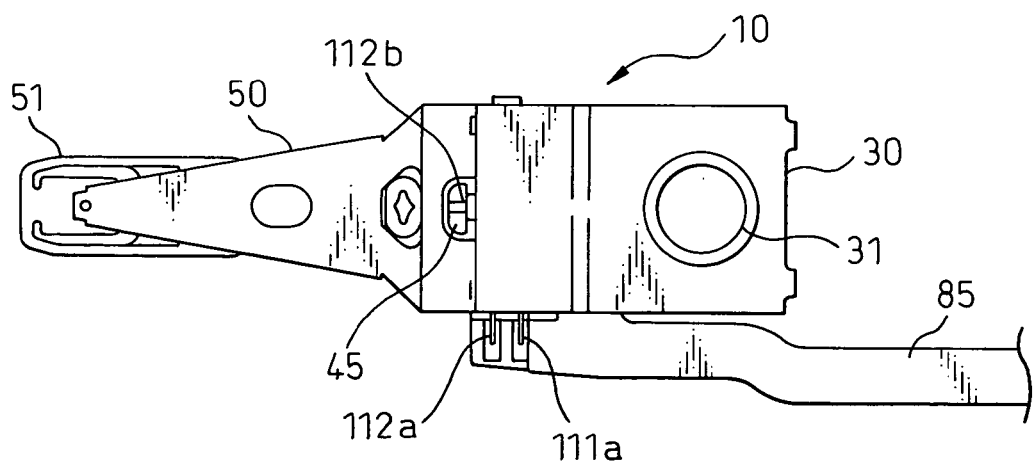
FIG. 6C is a bottom view thereof.
Figure 7A:
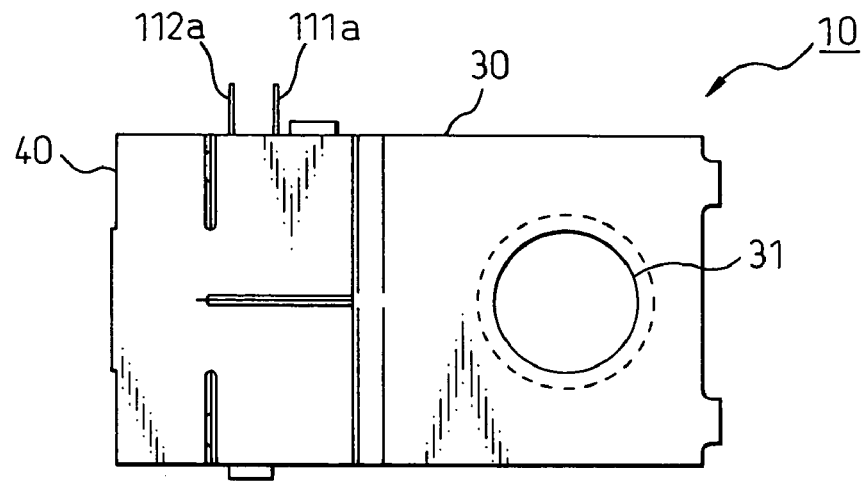
FIG. 7A is a top view of an actuator unit in accordance with the first embodiment of the present invention.
Figure 7B:
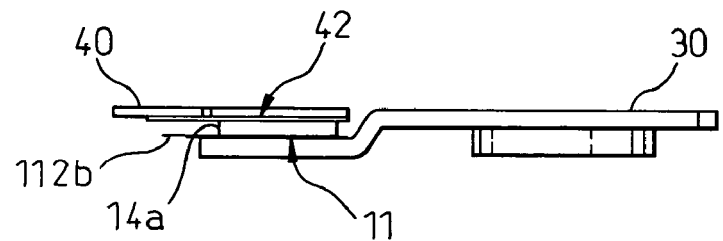
FIG. 7B is a side view thereof.
Figure 7C:
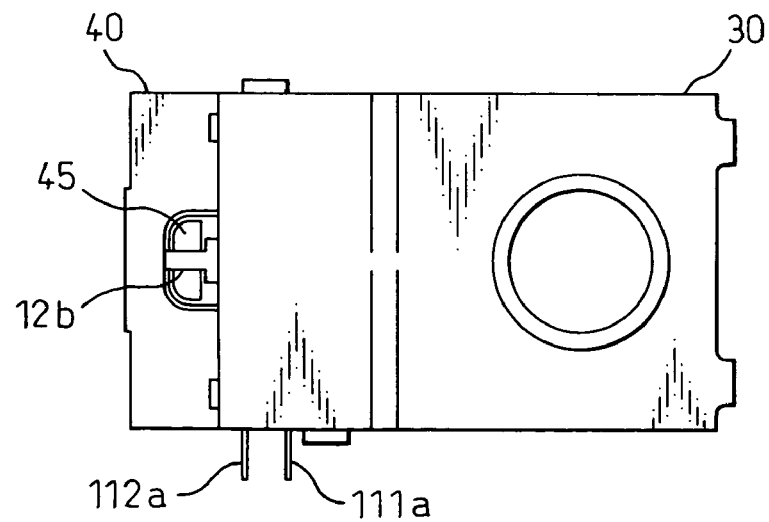
FIG. 7C is a bottom view thereof.

As shown in FIG. 6C, FIG. 7A, and FIG. 7C, according to the present embodiment, the base electrode 11 has a first lead 111*a* and a second lead 112*a* projecting out of a lateral side of the base 30 included in the actuator unit 10 for the purpose of electric connections required to drive the piezoelectric elements. Moreover, as seen from FIG. 6B, FIG. 6C, FIG. 7B, and FIG. 7C, the base electrode 11 has a third lead 112*b* projecting forward from the base 30. The first lead 111*a* and second lead 112*a* constitute a pair of terminals. The pair of terminals 111*a* and 112*a* is connected to a wiring for driving the piezoelectric elements, which is included in a wiring member 85, for example, a relay FPC (FIG. 6C). The wiring member 85 includes, as shown in FIG. 6A, a reading/writing signal line over which data is written or read in or from a head. The third lead 112*b* serves as a terminal via which the base electrode conducts electricity to the movable electrode, and is, as shown in FIG. 6C, folded towards the movable electrode 42 and attached to a connector 45 of the movable electrode 42.

To be more specific, the leads 111*a*, 112*a*, and 112*b* are formed by externally extending two conducting layers formed on an insulating layer placed on the base. In other words, the first lead 111*a* is formed by extending the conducting layer of the electrode placed on the stationary sides of the piezoelectric elements. The second lead 112*a* and third lead 112*b* are formed by extending the other conducting layer isolated from the conducting layer of the electrode placed on the stationary sides of the piezoelectric elements. Thus, electricity is conducted to the electrode placed on the stationary sides of the piezoelectric elements via the first lead 111*a* over the relay wiring board 85. Electricity is conducted to the electrode placed on the movable sides of the piezoelectric elements via the second lead 112*a* and third lead 112*b*.

Figure 8A:
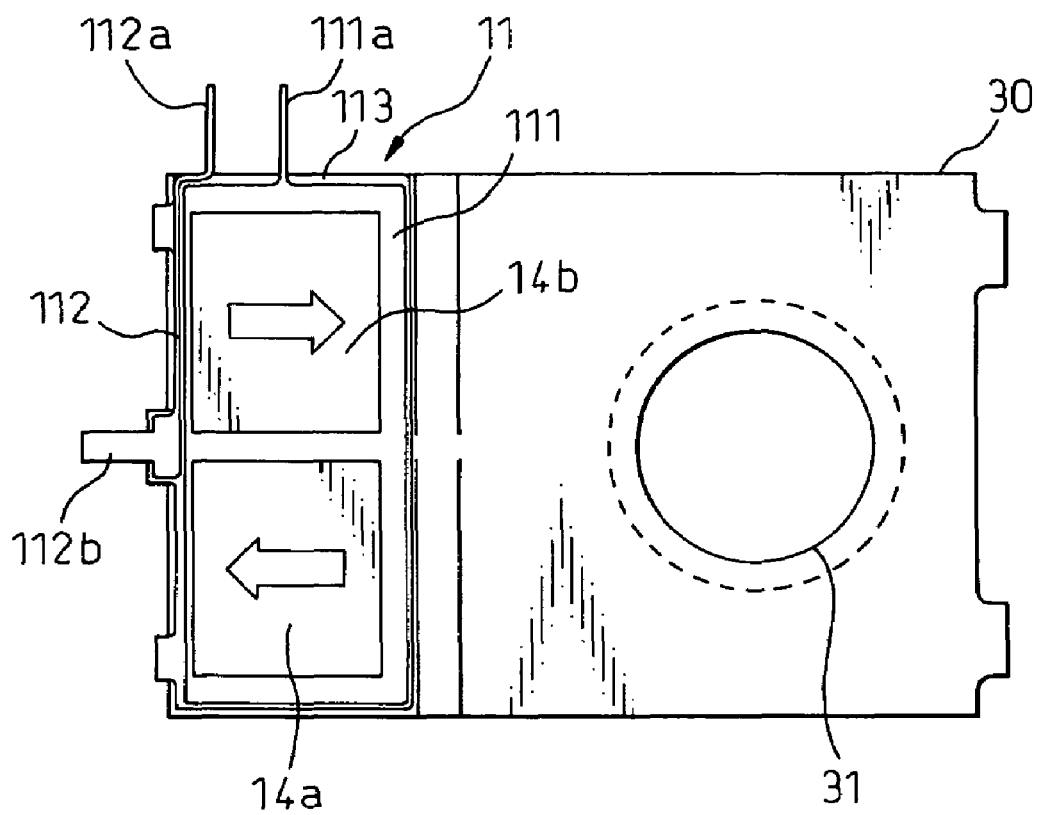
FIG. 8A is a top view of a base assembly included in an actuator in accordance with the first embodiment of the present invention and FIG. 8B is a side view thereof.
Figure 8B:
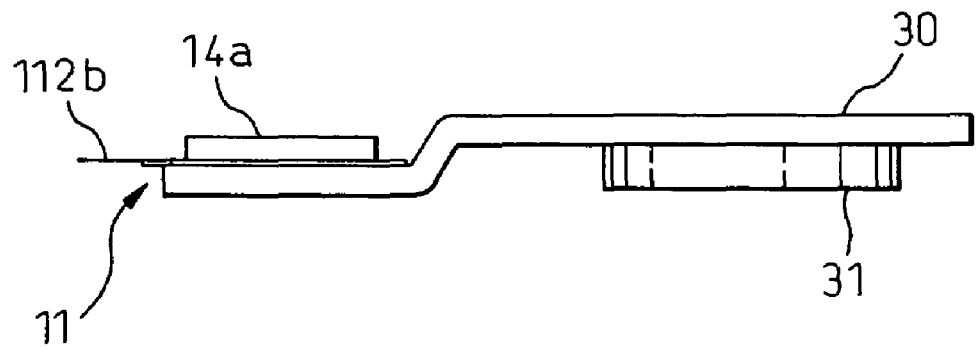

Next, referring to FIG. 8A to FIG. 9C, the wiring structure of the actuator unit 10 will be described. FIG. 8A and FIG. 8B show a base assembly included in the actuator unit 10. FIG. 8A is a front view and FIG. 8B is a side view. As shown in FIG. 8A, the base electrode 11 is joined to the actuator base 30 with an adhesive, and the piezoelectric elements 14*a* and 14*b* are joined to the top of the base electrode 11 with an adhesive. The base electrode 11 comprises three layers, that is, a SUS layer (not shown), a polyimide layer 113, and electric conducting layers 111 and 112 made of, for example, Cu. The SUS layer of the base electrode 11 is joined to the base 30 with an adhesive, and the first conducting layer 111 thereof is joined to the piezoelectric elements 14*a* and 14*b* with an adhesive. Preferably, the conducting layer 111 has a larger area than an area occupied by the piezoelectric elements 14*a* and 14*b*. The lead 111*a* that is an extension of the first conducting layer 111 is used to conduct electricity to the stationary sides of the piezoelectric elements 14a and 14b. According to the present embodiment, a relay conducting layer 112 whose extension is attached to the electrode placed on the movable sides of the piezoelectric elements is formed on the insulating layer 113 while being isolated from the conducting layer 111 fixed to the piezoelectric elements 14a and 14b. It should be noted that, in FIG. 8A, the directions of polarization in which the piezoelectric elements 14a and 14b are polarized are indicated with arrows.

The first lead 111a extending from the electrode 111 and the second lead 112a extending from one side of the relay conducting layer 112 project out of the same lateral side of the base 30, and constitute a pair of terminal electrodes. Moreover, the third lead 112b extending from other side of the relay conducting layer 112 projects out of the front end of the base 30. The leads 111a, 112a, and 112b are formed by extending only the conducting layer of the electrode having a three-layer structure, projecting out of the other SUS layer and polyimide layer of the electrode. In other words, the first lead 111a is formed by extending the conducting layer 11, and the second and third leads 112a and 112b are formed by extending the conducting layer 112 serving as an intermediate electrode. The leads are coated with Au, having an appropriate thickness, for reliable connection.

Figure 9A:
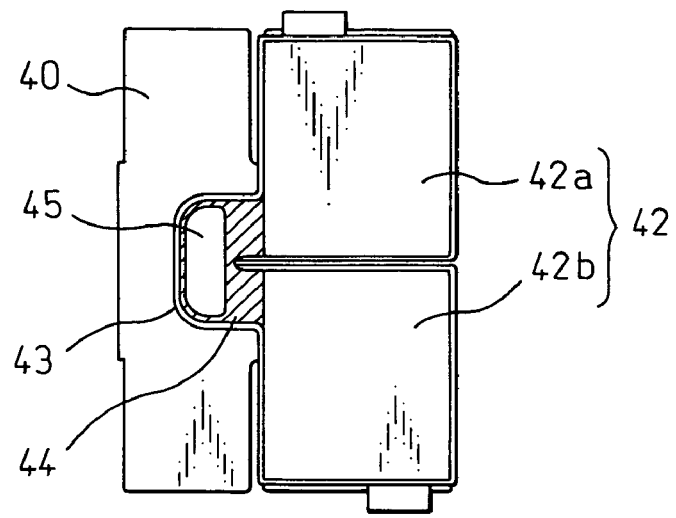
FIG. 9A is a top view of a movable assembly included in the actuator in accordance with the first embodiment of the present invention.
Figure 9B:
FIG. 9B is a side view thereof.
Figure 9C:
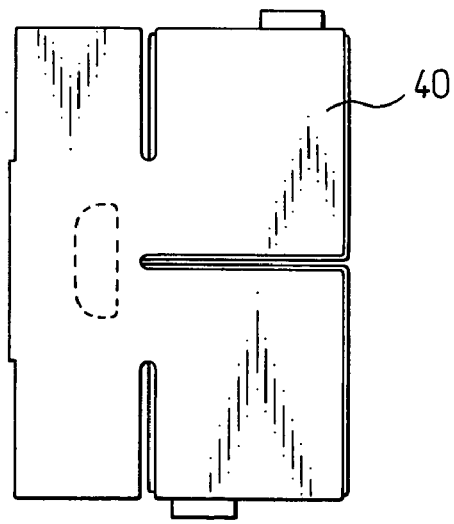
FIG. 9C is a bottom view thereof.

FIG. 9A to FIG. 9C show a movable assembly included together with the base assembly in the piezoelectric actuator unit 10. The movable assembly comprises a movable member 40 and a movable electrode 42 joined to the movable member 40 with an adhesive. The movable member 40 is used to secure a head suspension through spot welding, and is movable relative to a base fixed to a carriage arm. Three slits formed in the movable member 40 as shown in FIG. 9 serve as a mechanism for magnifying mechanical displacements made by the piezoelectric elements and transmitting them to a head. The movable electrode 42 has portions 42a and 42b thereof, which are joined to the two piezoelectric elements. 14a and 14b with an adhesive, partitioned with the slit for fear the displacements made by the piezoelectric elements may be interrupted. The portions 42a and 42b of the movable electrode 42 are connected by a portion 43 thereof. Similarly to the base electrode 11, the movable electrode 42 has three layers, that is, a SUS layer, a polyimide layer, a Cu layer integrated thereinto.

The portion 43 of the movable electrode 42 is opposed to the third lead 112b that is the extension of the relay conducting layer 112 of the base electrode. For prevention of corrosion of Cu applied as the conducting layer of the movable electrode, the portion 43 is coated with polyimide except a section needed for electric connection. The coat layer covers the margin of the electrode 42 and also covers the perimeter 44 of the portion 43 except a connector 45 thereof to which the lead 112b is attached. Moreover, the bared portion of the surface of the conducting layer of the connector 45 is coated with Au, at an appropriate thickness, for ultrasonic bonding.

The thus completed base assembly and movable assembly are layered, whereby the actuator unit is completed (see FIG. 7). Thereafter, the lead 112b that is an extension of the relay conducting layer 112 of the base electrode is thrust onto the connector 45 of the electrode included in the movable assembly, and then attached thereto by performing ultrasonic bonding. As the lead 112b is formed by extending the conducting layer, it can be readily deformed and thrust onto the connector. Thus, connection work is readily achieved. When the movable electrode 42 conducts electricity to the second lead 112a via the third lead 112b, if a voltage is applied to each of the first and second leads 111a and 112a, the voltage can be applied to the piezoelectric elements 14a and 14b interposed between the movable electrode 42 and base electrode 11.

Both the first and second leads 111a and 112a are attached to a window portion of a wiring member whose surface is coated with Au, that is, a window portion of a relay FPC 80 through ultrasonic bonding. Even in this case, the leads formed by extending the conducting layer are readily deformed and attached.

According to the present embodiment, as ultrasonic bonding is adopted, unlike wire bonding, no load is imposed on a piezoelectric element. The drawback of cracking a piezoelectric element can be avoided. Moreover, as no wire is directly attached to the piezoelectric element, the level of ultrasonic energy required for bonding can be raised in order to achieve connection. Consequently, a bond strength can be increased. Moreover, the thickness of an Au film can be suppressed, and a cost can be suppressed. Moreover, the piezoelectric element will not be exposed. A highly reliable piezoelectric actuator can be realized. For further increasing the bond strength, bonded parts may be coated with an adhesive or the like. Even in this case, compared with when wire bonding is adopted, the number of parts involved in the ultrasonic bonding is small. The number of places where coating is needed is small. Needless to say, soldering or any other method may be substituted for ultrasonic bonding.

In the present embodiment, an electrode having a three-layer structure, that is, including a SUS layer, a polyimide layer, and a conducting layer is adopted. The SUS layer may be omitted or replaced with any other material. Moreover, the material to be applied as an insulating layer is not limited to polyimide.

Second Embodiment

Figure 10:
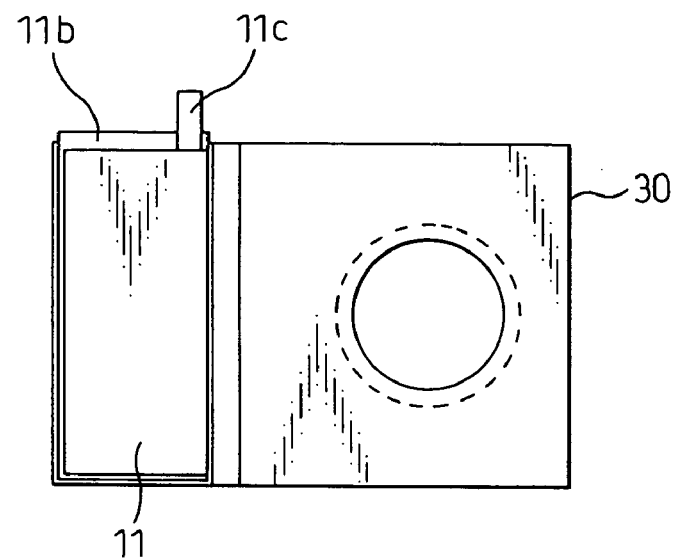
FIG. 10 is a front view showing a base assembly included in an actuator in accordance with a second embodiment of the present invention.
Figure 11A:
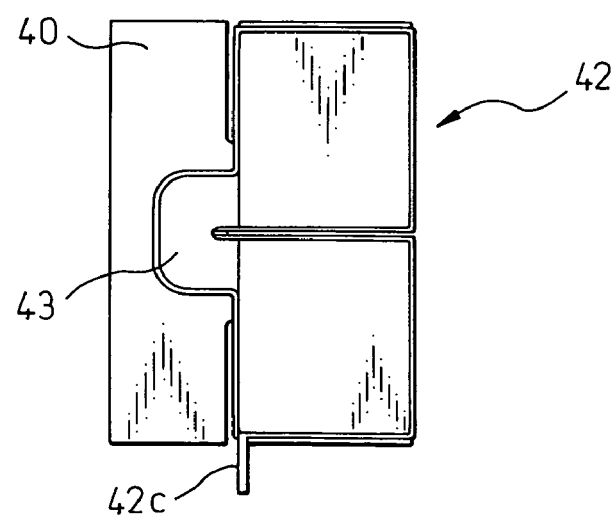
FIG. 11A is a front view of a movable assembly included in the actuator in accordance with the second embodiment of the present invention and FIG. 11B is a side view thereof.
Figure 11B:
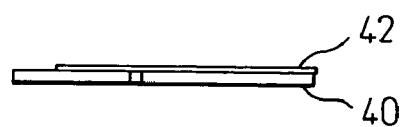

FIG. 10 and FIG. 11 show a second embodiment of the present invention. In the first embodiment, a pair of terminals to be attached to a relay FPC is formed as portions of a base electrode. In the second embodiment, terminals constituting a pair of terminals are led out from a movable electrode and a base electrode respectively.

FIG. 10 shows a base assembly included in an actuator unit in accordance with the second embodiment. A base electrode 11 is formed on a base 30. The base electrode 11 has three layers, that is, a SUS layer, a polyimide layer, and a conducting layer integrated thereinto. Moreover, the conducting layer of the electrode 11 is extended to form a lead 11c. In this embodiment, as seen from FIG. 10, the SUS layer serving as a support and the polyimide layer 116 serving as an insulating layer share the same area and are layered. The conducting layer whose area is smaller than that of the insulating layer and which is formed on the insulating layer is extended outside, whereby the lead 11c is formed.

FIG. 11 shows a movable assembly included in the actuator unit in accordance with the second embodiment. A movable electrode 42 is formed on a movable member 40. The movable electrode 42 comprises three layers, that is, a SUS layer, a polyimide layer, and a conducting layer. The conducting layer of the movable electrode 42 is extended to form a lead 42c of the movable electrode 42. As described in conjunction with FIG. 9, a portion 43 of the movable electrode 42 having nothing to do with electric connection may be coated with polyimide serving as a protective layer.

In this embodiment, the base assembly shown in FIG. 10 and the movable assembly shown in FIG. 11 clamp piezoelectric elements 14a and 14b, whereby a piezoelectric actuator unit is formed. The piezoelectric actuator unit is connected to a wiring patterned on a relay FPC via the leads 111c and 42c formed as the respective extensions of the base and movable electrodes.

The foregoing structure is simpler than the one employed in the first embodiment. The number of parts involved in bonding can be decreased, and the cost can be reduced. However, as the leads are formed as the extensions of the conducting layers, the thickness of the conducting layers must be about 15 μm. In the present embodiment in which the leads must be located up and down, the total thickness of the conducting layers is twice as large as that in the first embodiment in which the leads need not be located up and down. Namely, the first embodiment is more suitable for realization of a thinner actuator unit.

A head suspension assembly including a magnetic head according to the present invention has, as described previously, a base 30 of a piezoelectric actuator unit 10 fixed to a carriage arm via a caulking convex part 31. The head suspension assemblies constitute a head stack shown in FIG. 1A to FIG. 1C. The head stack is used as a head moving mechanism to be included in a magnetic disk drive.

Figure 12:
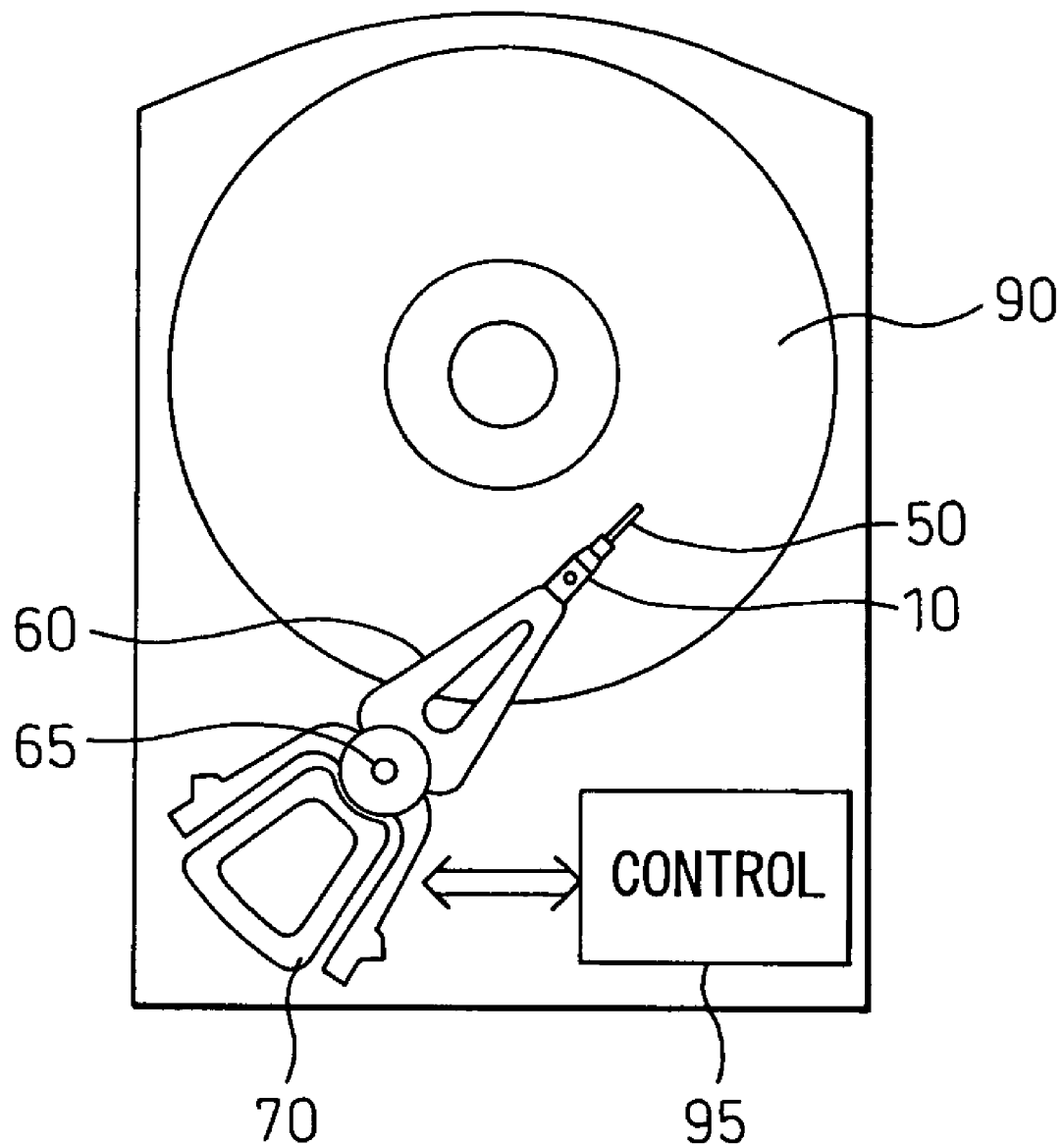
FIG. 12 schematically shows a magnetic disk drive employing a head stack including a micro-actuator in accordance with the present invention.

FIG. 12 is a schematic plan view of the magnetic disk drive. Magnetic disks 90 are stacked with a space, which allows a head to move, between adjoining disks. In this embodiment, similarly to the one shown in FIG. 1, three magnetic disks are disposed.

Similarly to FIG. 1, the head stack includes six heads so as to cope with three magnetic disks. The head stack comprises: head suspensions 50 each of which includes a slider having a head mounted thereon; piezoelectric actuator units 10 in accordance with the present invention each of which bears the head suspension 50 so that the head suspension 50 can move; and carriage arms each of which bears the base 30 of each of the piezoelectric actuator units 10. Each of the carriage arms 60 pivots on a shaft 65 to move in a radial direction of the magnetic disk 90 by means of a driving voice coil movement (VCM) 70. Herein, a voltage is applied to the piezoelectric actuator unit 10 by the structure of connecting a piezoelectric actuator to a relay FPC disposed along the carriage arm 60 as described in relation to the first embodiment. The relay FPC is connected to a control circuit 95 via an FPC having an amplifier IC mounted thereof. The control circuit 95 includes an I/O terminal via which the control circuit can be connected to external equipment (for example, a computer) outside the magnetic disk drive.

An example in which a piezoelectric actuator is utilized as a micro-actuator for a head suspension has been described so far. The present invention can be adapted to any equipment in which piezoelectric elements are used as an actuator. For example, the present invention can be adapted to a probe used to sense a minute displacement in a tunneling electron microscope.

The invention claimed is:

1. A piezoelectric actuator comprising:
   a piezoelectric element; and
   first and second electrodes clamping said piezoelectric element, wherein:
   said first electrode includes an insulating layer, a first conducting layer formed on said insulating layer and brought into contact with one side of said piezoelectric element, and a second conducting layer isolated from said first conducting layer;
   said first conducting layer has a first connection terminal projecting from an edge of said insulating layer;
   said second conducting layer has second and third connection terminals projecting from the edge of said insulating layer; and
   said first and second connection terminals constitute a pair of terminal electrodes, and said third connection terminal is connected to said second electrode.

2. A piezoelectric actuator according to claim 1, wherein said second electrode has a connector opposed to said third connection terminal.

3. A piezoelectric actuator according to claim 1, wherein said connection terminals are coated with Au.

4. A piezoelectric actuator according to claim 1, further comprising a wiring member connected to a power supply, wherein said pair of terminal electrodes is attached to said wiring member.

5. A piezoelectric actuator according to claim 4, wherein said wiring member is a flexible printed-circuit board.

6. A piezoelectric actuator according to claim 1, wherein said piezoelectric element is polarized in a direction perpendicular to a direction in which a voltage is applied, and makes a shear strain with application of the voltage.

7. A piezoelectric actuator according to claim 6, wherein said piezoelectric element and other piezoelectric element that is polarized in a direction opposite to the direction in which said piezoelectric element is polarized and that makes a shear strain with application of a voltage are juxtaposed.

8. A piezoelectric actuator according to claim 1, wherein said first electrode further comprises an SUS layer and said second electrode comprises an SUS layer, an insulating layer, and a conducting layers and said conducting layer of said second electrode having connection terminal projecting from the edge of said SUS layer and said insulating layer of said second electrode.

9. A head suspension unit comprising a head suspension that includes a magnetic head, a base fixed to a carriage arm, and a movable member that bears said head suspension, and having a piezoelectric actuator clamped by said base and said movable member so that said suspension can be inched, wherein:
   a piezoelectric actuator set forth in claim 1 is adopted as said piezoelectric actuator.

10. A magnetic disk drive comprising a magnetic disk in which data can be stored, and a head suspension unit fixed to a carriage arm that can pivot on a predetermined shaft, wherein:
    a head suspension unit set forth in claim 9 is adopted as said head suspension unit.

11. A piezoelectric actuator comprising:
    a piezoelectric element; and
    first and second electrodes clamping said piezoelectric element, wherein:
    at least one of said first and second electrodes includes an insulating layer, and a conducting layer formed on said insulating layer and brought into contact with said piezoelectric element; and
    said conducting layer has a connection terminal projecting from an edge of said insulating layer.

12. A piezoelectric actuator according to claim 11, wherein the other of said first and second electrodes has a conducting layer brought into contact with said piezoelectric element, said conducting layer having a connection terminal projecting from the edge of said insulating layer.

13. A piezoelectric actuator according to claim 11, wherein said connection terminal is coated with Au.

14. A piezoelectric actuator according to claim 11, further comprising a wiring member connected to a power supply, wherein said connection terminal is attached to said wiring member.

15. A piezoelectric actuator according to claim 14, wherein said wiring member is a flexible printed-circuit board.

16. A piezoelectric actuator according to claim 11, wherein said piezoelectric element is polarized in a direction perpendicular to a direction in which a voltage is applied, and makes a shear strain with application of the voltage.

17. A piezoelectric actuator according to claim 16, wherein said piezoelectric element and another piezoelectric element that is polarized in a direction opposite to the direction in which said piezoelectric element is polarized and that makes a shear strain with application of a voltage are juxtaposed.

18. A piezoelectric actuator according to claim 11, wherein said one of first and second electrodes further comprises an SUS layer and the other of said first and second electrodes comprises an SUS layer, an insulating layer, and a conducting layer, said conducting layer of said other of said first and second electrodes having a connection terminal projecting from the edge of said SUS layer and said insulating layer of said other of said first and second electrodes.

19. A head suspension unit comprising a head suspension that includes a magnetic head, a base fixed to a carriage arm, and a movable member that bears said head suspension, and having a piezoelectric actuator clamped by said base and said movable member so that said suspension can be inched, wherein:

a piezoelectric actuator set forth in claim 11 is adopted as said piezoelectric actuator.

20. A magnetic disk drive comprising a magnetic disk in which data can be stored, and a head suspension unit fixed to a carriage arm that can pivot on a predetermined shaft, wherein:

a head suspension unit set forth in claim 19 is adopted as said head suspension unit.

* * * * *